(12) United States Patent
Gee (10) Patent No.: US 7,398,441 B1
(45) Date of Patent: Jul. 8, 2008

(54) SYSTEM AND METHOD FOR PROVIDING SECURE BOUNDARY SCAN INTERFACE ACCESS

(75) Inventor: John K. Gee, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 218 days.

(21) Appl. No.: 11/314,594

(22) Filed: Dec. 21, 2005

(51) Int. Cl.
*G01R 31/28* (2006.01)
*G06F 11/00* (2006.01)

(52) U.S. Cl. ........................... 714/727; 714/736
(58) Field of Classification Search .......... 714/724, 714/726–727, 30, 733–736, 819; 726/2, 726/4, 11, 17, 21, 26, 28, 30; 711/100; 713/161
See application file for complete search history.

(56) References Cited

U.S. PATENT DOCUMENTS

| | | | | |
|---|---|---|---|---|
| 5,457,408 A | * | 10/1995 | Leung | 326/38 |
| 5,894,213 A | * | 4/1999 | Nakamura | 340/146.2 |
| 6,574,762 B1 | * | 6/2003 | Karimi et al. | 714/727 |
| 7,274,283 B2 | * | 9/2007 | Yosim et al. | 340/5.74 |

\* cited by examiner

*Primary Examiner*—Phung M Chung
(74) *Attorney, Agent, or Firm*—Nathan O. Jensen; Kyle Eppele (57) ABSTRACT

The present invention is a method including: receiving an input key string; comparing the input key string with a stored key string; and granting access to a boundary scan chain when the input key string matches the stored key string, the boundary scan chain being at least one of: a Boundary Data Register of at least one Joint Test Action Group (JTAG)-compliant device; or, a plurality of communicatively coupled JTAG-compliant devices.

5 Claims, 10 Drawing Sheets

SYSTEM AND METHOD FOR PROVIDING SECURE BOUNDARY SCAN INTERFACE ACCESS

FIELD OF THE INVENTION

The present invention relates to the field of integrated circuits and particularly to a system and method for providing secure boundary scan.

BACKGROUND OF THE INVENTION

A number of today's highly integrated, multi-layer circuit boards with fine pitch integrated circuits are virtually impossible to access physically for testing. Some traditional testing methods, such as functional test, only access a board's primary I/Os (input/outputs), thereby providing limited coverage and poor diagnostics for board network faults. Other traditional testing methods, such as in-circuit testing, involve physically accessing each wire on the board via "bed of nails" probes and testers, and may be expensive to implement. To alleviate the growing costs of designing and producing digital systems, boundary scan was developed as a way to test interconnects (i.e., thin wire lines) on a printed circuit board without using physical probes. However, along with providing functional and interconnect testing capabilities, boundary scan may also be utilized to provide built-in self test procedures. Boundary scan has basically transformed a number of extremely difficult PCB (printed circuit board) testing problems into problems that can be dealt with via software control.

Boundary scan provides the above-referenced capabilities by providing an interface into embedded digital electronics. Boundary scan may be utilized to provide various functions, such as board test, chip test, and system debug functions. However, with current implementations of boundary scan, such functions require extensive access to hardware and software throughout a system, thereby making it difficult to ensure protection of critical or sensitive information from unwarranted access.

Therefore, it may be desirable to have a system and method for providing secure boundary scan interface access which addresses the above-referenced problems and limitations of the current solutions.

SUMMARY OF THE INVENTION

Accordingly, an embodiment of the present invention is directed to a method including: receiving an input key string; comparing the input key string with a stored key string; and granting access to a boundary scan chain when the input key string matches the stored key string, the boundary scan chain being at least one of: a Boundary Data Register of at least one Joint Test Action Group (JTAG)-compliant device; or, a plurality of communicatively coupled JTAG-compliant devices.

A further embodiment of the present invention is directed to an apparatus, including: a shift register including a plurality of flip-flops for receiving an input key string; a plurality of XNOR gates communicatively coupled with the shift register for comparing the input key string with a stored key string; and a multi-input AND gate communicatively coupled with the plurality of XNOR gates for receiving input signals from the plurality of XNOR gates, wherein the input signals received from the plurality of XNOR gates drive the AND gate high when the input key string matches the stored key string thereby granting a user access to a boundary scan chain, the boundary scan chain being at least one of: a Boundary Data Register of at least one Joint Test Action Group (JTAG)-compliant device; or, a plurality of communicatively coupled JTAG-compliant devices.

An additional embodiment of the present invention is directed to a method, including: providing an inhibit pin to a chip containing sensitive data; driving the inhibit pin low via a Test Access Port (TAP) control signal; and inhibiting sensitive data from exiting the chip by preventing the sensitive data from reaching at least one output pin of the chip.

A further embodiment of the present invention is directed to a method, including: providing a secure-wise chip including an enhanced Test Access Port (TAP) controller; disabling boundary scan interface access to a plurality of chips, each chip included in the plurality of chips being communicatively coupled with the secure-wise chip; sanitizing each chip included in the plurality of chips of sensitive data; and enabling boundary scan interface access to each chip included in the plurality of chips when sanitizing is complete.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
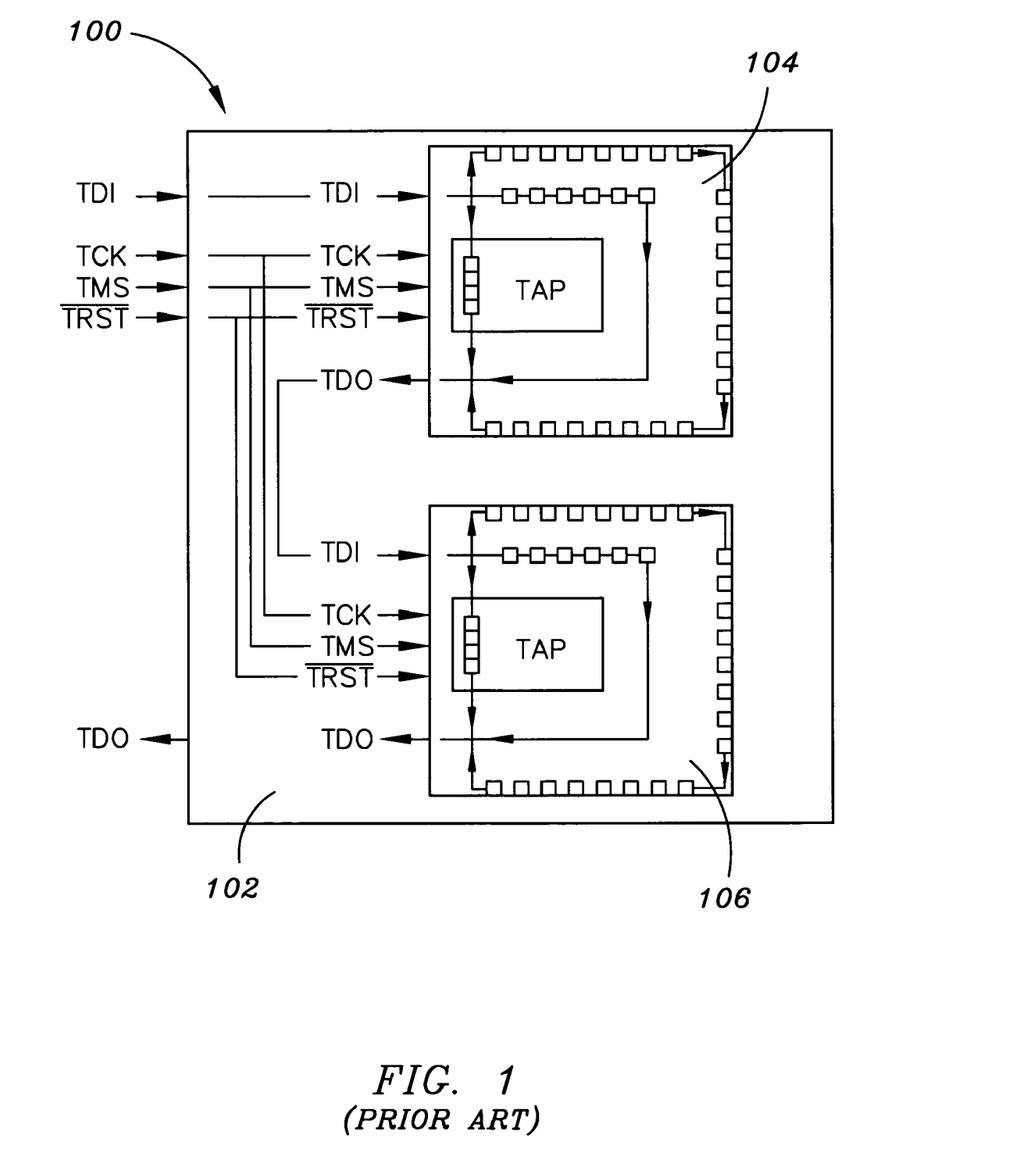
FIG. 1 is an illustration of a prior art configuration for a boundary scan system.

FIG. 1 illustrates a prior art configuration for a boundary scan system 100. Included in the illustrated configuration is a printed circuit board 102 connected with a first chip 104 and a second chip 106. The first and second chips (104, 106) are each configured with a plurality of boundary scan interface pins, the plurality of boundary scan interface pins including a Test Data In (TDI) pin, a Test Data Out (TDO) pin, a Test Clock (TCK) pin, a Test Mode Select (TMS) pin, and a Test Reset (TRST) pin. The printed circuit board 102 includes an edge connector input TDI, an edge connector output TDO, and TCK, TMS and TRST inputs, communicatively coupled with the corresponding boundary scan interface pins of the chips (104, 106). When performing a boundary scan test for the illustrated system 100, input signals may be provided by a user via the circuit board inputs. For example, the user may provide the input signals via a boundary scan interface (not shown), such as a personal computer implementing boundary scan testing hardware/software connected to the circuit board via an interface pod. The input signals may then be communicated to the TDI pin of the first chip 104, the input signals indicating which boundary scan test the user wants performed. On-chip boundary scan logic receives the input signal via the TDI pin of the chip 104 and allows for the requested boundary scan test to be performed, resulting in an output signal being shifted out of the TDO of the first chip 104. In the illustrated embodiment, the first and second chips (104, 106) form a boundary scan chain in which the TDO pin of the first chip 104 is communicatively coupled with the TDI pin of the second chip 106 for providing daisy-chain access to the second chip 106. For instance, the input signal received by the TDI of the first chip 104, may be shifted through both the first and second chips and then shifted out of the TDO of the second chip 106, and communicated to the TDO of the circuit board 102 as an output signal which contains the test results data for the boundary scan chain, which may be then analyzed by the user via the boundary scan interface. It is contemplated that any number of Joint Test Action Group (JTAG) devices (ex. —chips) may be daisy-chained together to form a boundary scan chain for boundary scan testing.

Each chip (104, 106) further includes a Test Access Port (TAP) Controller with an Instruction Register (IR) for controlling boundary scan activity on that chip. In an exemplary embodiment, the TAP controller is a 16-state finite state machine that generates internal control signals for controlling boundary scan activity. Further, the TCK, TMS, and TRST pins of each chip (104, 106) also function to provide control for boundary scan activity on their respective chips (104 or 106) by feeding signals to the TAP Controller. Both chips (104, 106) are further configured with a plurality of Data Registers (DRs) including a Boundary Data Register for providing the "true" boundary scan at the pins and other Data Registers for providing access to data throughout the chip. However, because boundary scan activity may require extensive access to internal chip data and to chip boundary data internal to the system 100, it may be difficult to protect sensitive data from rogue (i.e., "unauthorized") boundary scan interface access. It is further contemplated that boundary scan chain may also refer to a Boundary Data Register of at least one JTAG-compliant device (ex. —chip).

Figure 2:
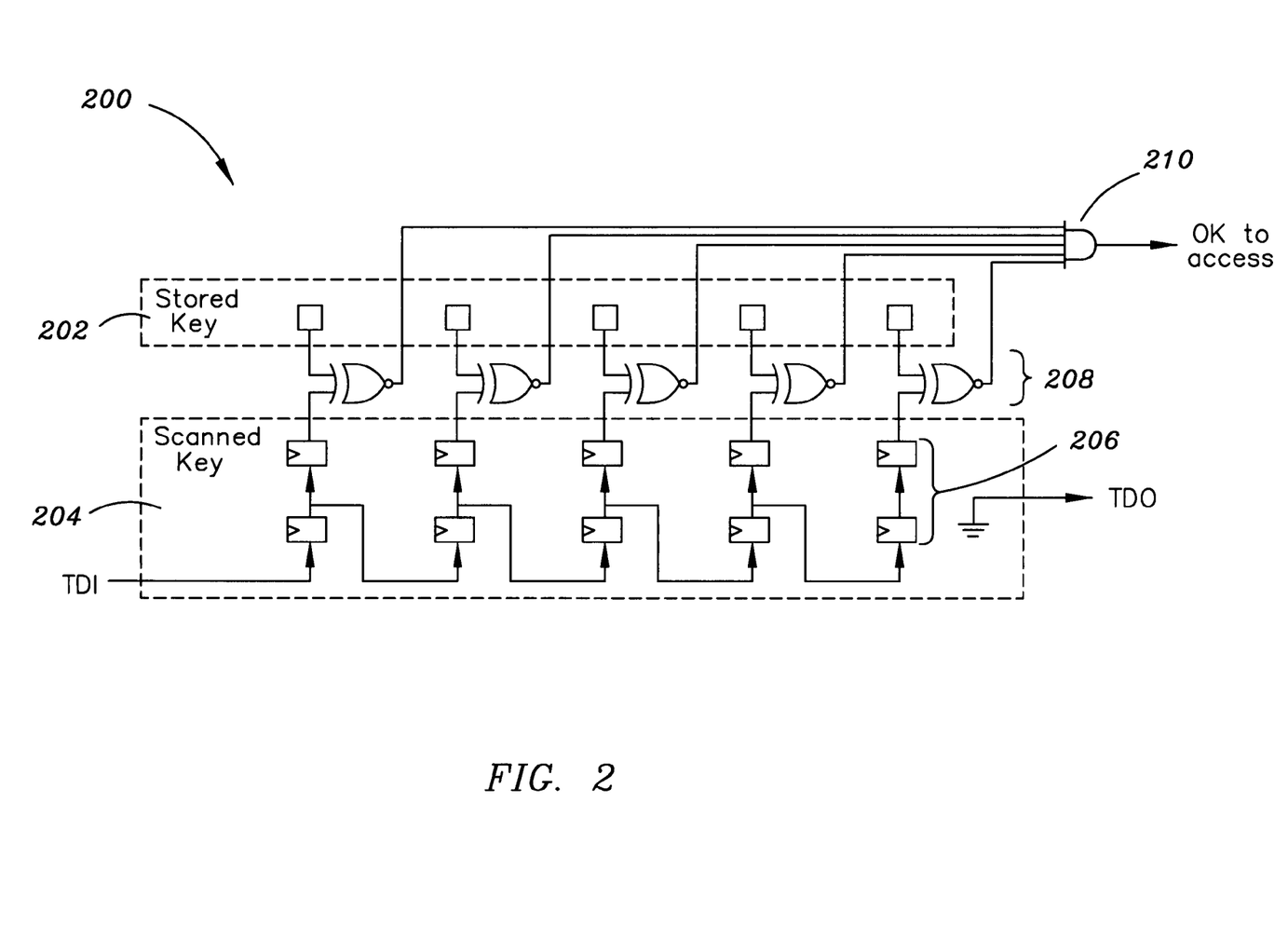
FIG. 2 is an illustration of key string compare logic for restricting access to one or more boundary scan chains in accordance with an exemplary embodiment of the present invention.

Referring to FIG. 2, key string compare logic for restricting access to one or more boundary scan chains in accordance with an exemplary embodiment of the present invention is shown. In a present embodiment, one or more chips of a boundary scan chain (as in FIG. 1), may include key string compare logic 200 for restricting access to the boundary scan chain. For example, the key string compare logic 200 may include one or more stored key strings 202, each stored key string associated with one or more corresponding boundary scan test functions. Further, each stored key string 202 is known only to an authorized user so that only an authorized user may perform the boundary scan test function(s) corresponding to that stored key string 202. In the illustrated embodiment in FIG. 2, the key string compare logic 200 is shown comparing a scanned key string 204, which has been entered by a user via the boundary scan interface, with a stored key string 202. In the exemplary embodiment, the key string compare logic 200 includes a shift register 206 including a plurality of flip-flops for receiving an input/scanned key string 204 and for shifting the input key string 204 through the shift register 206 with each clock pulse. The key string compare logic 200 further includes a plurality of XNOR gates 208 communicatively coupled with the shift register 206 for comparing the input/scanned key string 204 with the stored key string 202. The key string logic, compare logic 200 further includes a multi-input AND gate 210 communicatively coupled with the plurality of XNOR gates 208 for receiving input signals from the plurality of XNOR gates. If the scanned key string 204 matches the stored key string 202, the XNOR gates 208 of the key string compare logic 200 generate input signals which are received by the AND gate 210, and drive the AND gate high thereby allowing access to the restricted boundary scan chain, and thus, for the user's choice of requested, boundary scan tests associated with the stored key string 202 to be carried out. If the scanned key string 204 does not match the stored key string 202, the XNOR gates 208 of the key string compare logic 200 will generate input signals for reception by the AND gate 210 which drive the AND gate low, thereby denying the user access to the functions associated with the stored key string 202. In the illustrated embodiment, the stored key string 202 and the scanned key string 204 are 5-bit key strings. It is contemplated that the strength of protection of the key string is determined by the number of bits in the key string, so key strings may be implemented with the present invention which are hundreds of bits long.

In further embodiments, the stored key strings 202 implemented with the key string compare logic 200 may be hardwired (i.e, fixed, non-programmable). In alternative embodiments the stored key strings 202 implemented with the key string compare logic 200 may be programmable, preferably via a secure means. For instance, a stored key string 202 may be programmed so that its corresponding functions are accessible without requiring the user to know or scan in a corresponding scanned key string 204. This may be particularly useful during system build and test, so that build and test personnel may readily perform desired boundary scan test functions for testing of the system. Further, once the build and test stage has passed and the system has reached an end user, the stored key string 202 may be reprogrammed by the end user so that a scanned key string 204, known only to the end user, must be scanned in prior to accessing boundary scan test functions associated with the stored key string 202, thereby discouraging unauthorized access and thus, protecting sensitive data from rogue boundary scan interface access. Additionally, the key string compare logic 200 may be established so that certain instructions, such as the EXTEST (External Test) and RUN BIST (Built-In Self Test) instructions, which are commonly utilized by factory personnel after initial system build for board and chip-level self-testing, and by field personnel during system checkout and maintenance, may be performed without user knowledge or entry of any keys or passwords.

In additional embodiments, access to functions corresponding to the stored key 202 may be restricted in a mutually exclusive manner. For instance, if key string compare logic 200 is implemented in the boundary scan system 100 shown in FIG. 1, a first user may be able to enter a scanned key string 204 which matches a stored key string 202 for allowing the user access to boundary scan functions associated with the stored key string 202. Further, the key string compare logic 200 may be programmed to only allow the user to perform the associated boundary scan functions on the portion of the system 100 for which that user is authorized. For example, the user may be restricted to performing the associated boundary scan functions on only the first chip 104 or the second chip 106. Alternatively, the system may contain multiple boundary scan chains, each containing a plurality of chips, and the user may be restricted to performing the associated boundary scan functions on the boundary scan chain(s) for which the user is authorized. It is further contemplated that the key string compare logic 200 discussed above may also be implemented for preventing access to a single boundary scan chain within a single chip, such as the previously described Boundary Data Register.

Figure 3:
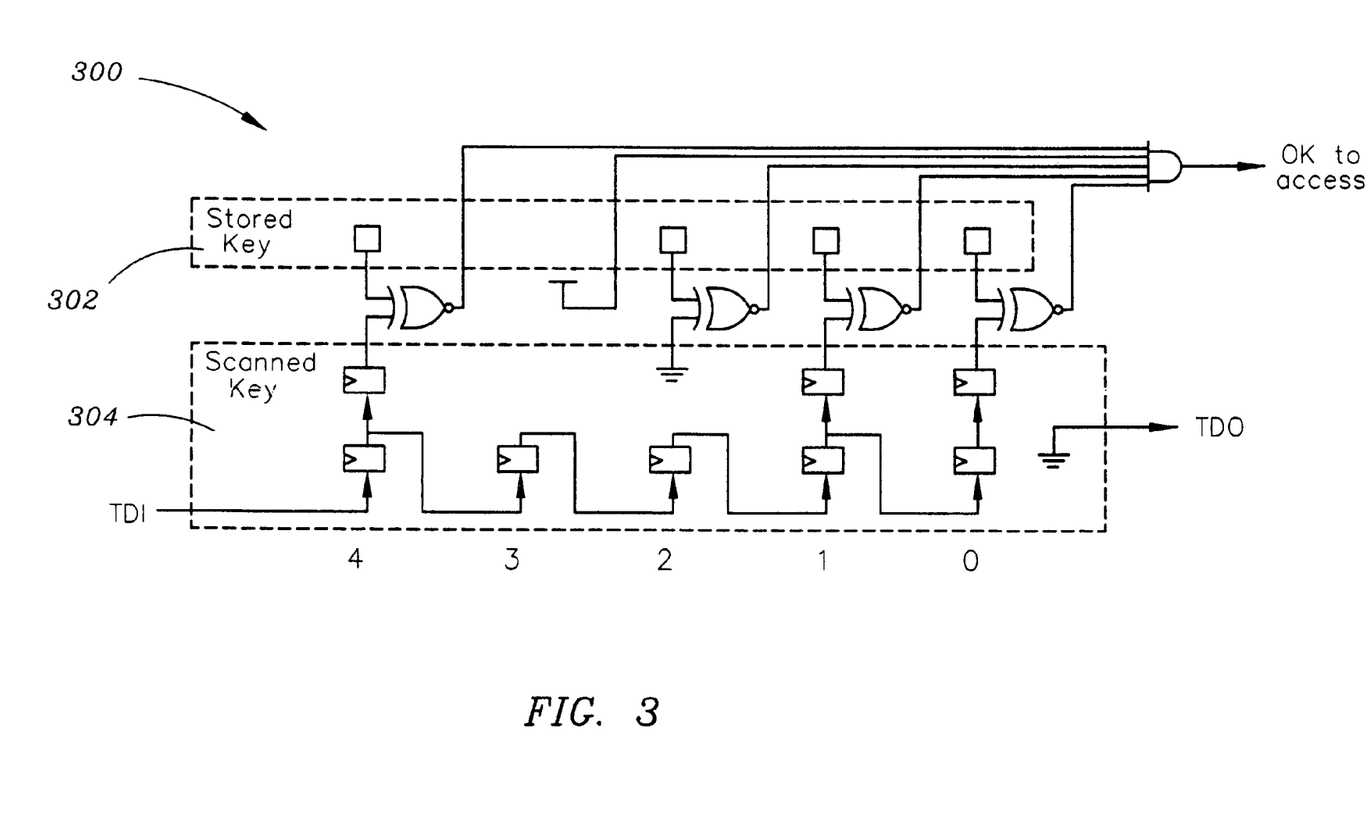
FIG. 3 is an illustration of key string compare logic for restricting access to one or more boundary scan chains, the key string compare logic including special features in accordance with an exemplary embodiment of the present invention.

FIG. 3 illustrates key string compare logic 300 with special features in accordance with exemplary embodiments of the present invention. The illustrated logic 300 may be implemented as on-chip logic for implementation within one or more chips (104, 106) of a boundary scan system 100. In the exemplary embodiment, the stored key string 302 may include a lock out bit. For example, in the stored key string 302 of FIG. 3, the lockout bit is established at bit position 2 of the stored key string 302. In the illustrated embodiment, if the value of the lockout bit is zero, then a scanned key string 304 which appropriately corresponds to/matches the stored key string 302 will allow a user access to boundary scan testing functions associated with the stored key string 302. Contrastingly, if the value of the lockout bit is one, then no scanned key string 304 will allow the user access to boundary scan testing functions associated with the stored key string 302. In further embodiments, the stored key string 302 may include an inconsequential bit, such as a don't care bit. For instance, in the stored key string 302 of FIG. 3, the don't care bit is established at bit position 3 of the stored key string 302. In the illustrated embodiment, a scanned key string 304 which appropriately corresponds with the stored key string 302 at bit positions 0, 1, 2 and 4 respectively will allow the user to access boundary scan testing functions associated with the stored key string 302, regardless of the value at bit position 3 of the scanned key string 304. Inconsequential bits, as described above, may be implemented with a master key string, which may be scanned in for providing a user access to boundary scan functions associated with several different stored key strings.

Figure 4:
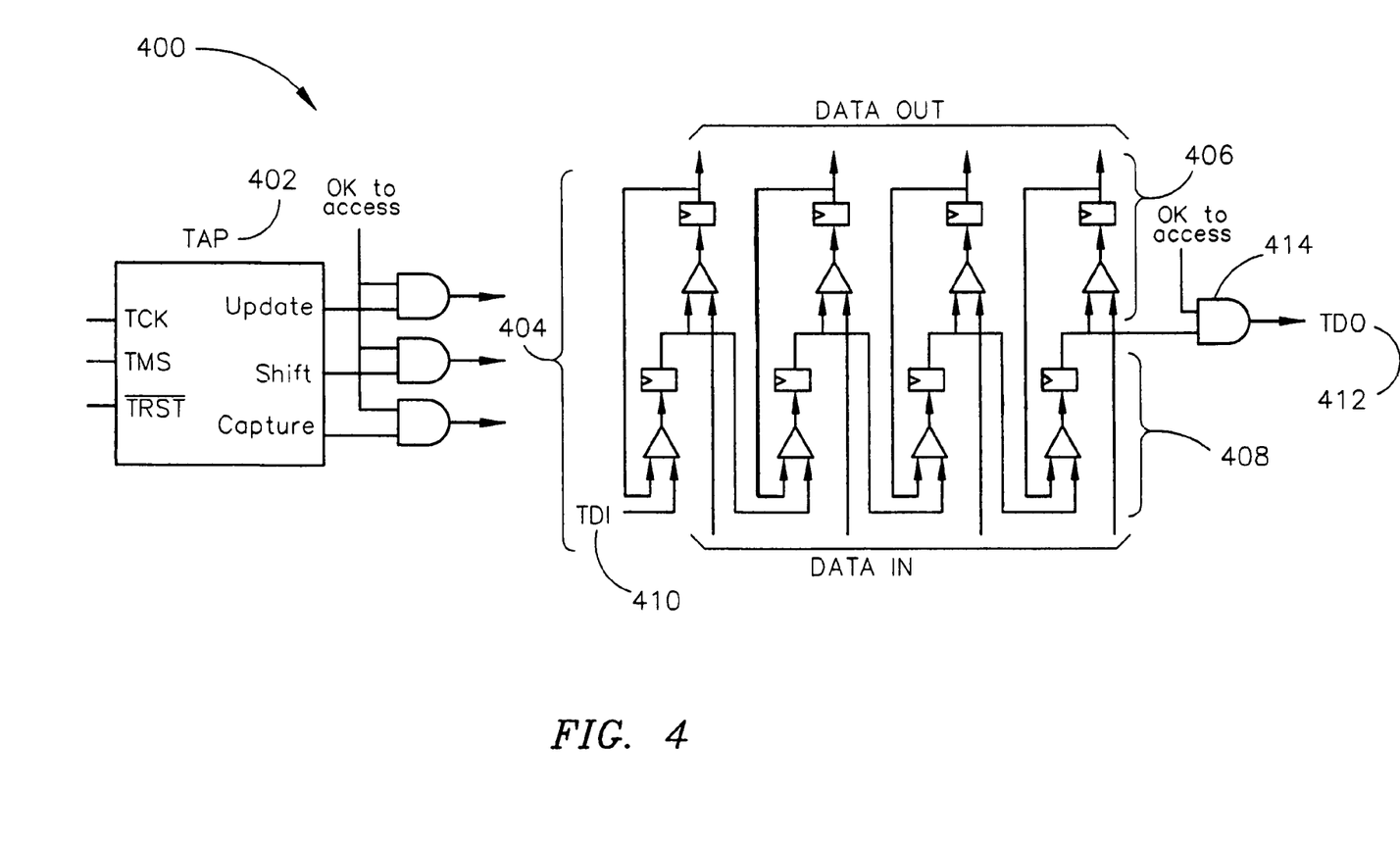
FIG. 4 is an illustration of a boundary scan chain implementing key string compare logic in accordance with an exemplary embodiment of the present invention.

FIG. 4 illustrates a boundary scan chain 400 implementing key string compare logic 300 in accordance with an exemplary embodiment of the present invention. The boundary scan chain 400 is communicatively couples with a TAP controller 402 and includes a Boundary Data Register 404. The Boundary Data Register 404 further includes a primary register 406 and shift register 408 connected between a TDI pin 410 and TDO pin 412. In the illustrated embodiment, the TAP controller's ability to control the Boundary Data Register 404 is inhibited by an "OK to access" line communicatively connected between the key string compare logic 300 and the TAP controller 402. For example, if key string compare logic 300 determines that the scanned key string 304 input by a user matches the stored key string 302, key string compare logic will send a signal via the "OK to access" line to the TAP controller to confirm that the user should be allowed to access the boundary scan chain 400, such as for performing the boundary scan testing functions associated with the stored key string 304. After receiving the confirmation signal, the TAP controller 402 will provide control, driven by received TCK, TMS signals, to the Boundary Data Register 404 for allowing test data to be shifted into the Boundary Data Register 404 via the TDI pin 410 and through the Boundary Data Register 404 towards the TDO pin 412. The "OK to access" line is further communicatively connected to a logic circuit 414, such as an AND gate, which is communicatively coupled with the TDO pin 412. After receiving a confirmation signal, the logic circuit will allow test data to be shifted out of the Boundary Data Register 404 via the TDO pin 410.

Figure 5:
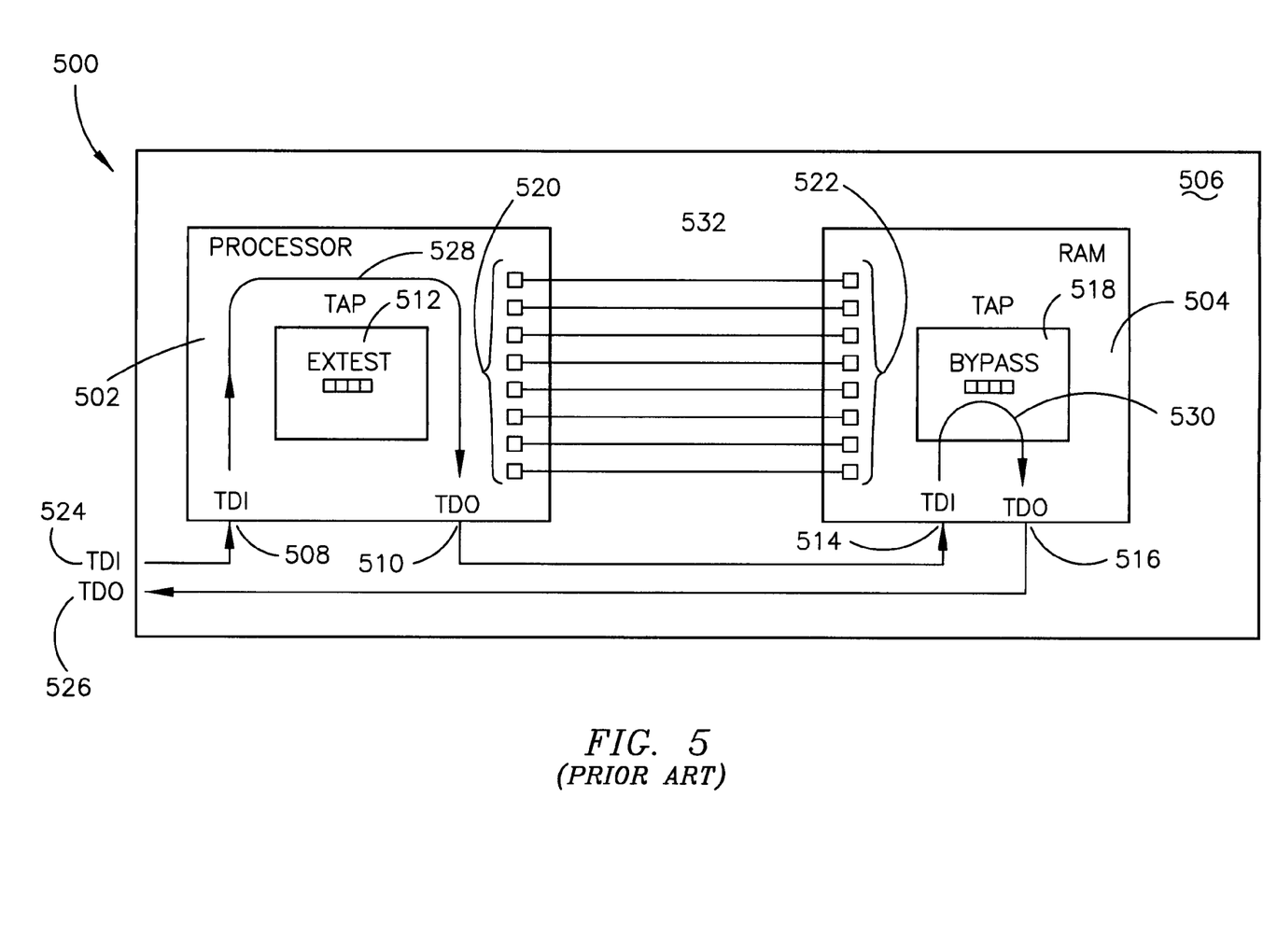
FIG. 5 is an illustration of a prior art configuration for a boundary scan system.

FIG. 5 illustrates a prior art configuration for a boundary scan system 500. The system 500 includes a first chip 502 and a second chip 504 connected to a printed circuit board 506. The first chip 502 is communicatively coupled with the second chip 504 to form a boundary scan chain. In the illustrated system 500, the first chip 502 is a Processor chip, while the second chip 504 is a RAM (Random Access Memory) chip. The Processor chip 502 includes a TDI pin 508, a TDO pin 510 and a TAP controller 512. The RAM chip 504 also includes a TDI pin 514, a TDO pin 516 and a TAP controller 518. The Processor chip 502 further includes a plurality of data pins 520 which are communicatively coupled with a plurality of data pins 522 of the RAM chip 504 via the printed circuit board 506. The printed circuit board 506 includes an edge connector input TDI 524 which is communicatively coupled with the Processor chip TDI pin 508. Further, the printed circuit board 506 includes an edge connector output TDO 526 which is communicatively coupled with the RAM chip TDO pin 516.

In the illustrated system, the Processor chip 502 has received an input signal from a user via a boundary scan interface (not shown) the input signal including two different boundary scan instructions, an EXTEST boundary scan instruction and a BYPASS boundary scan instruction. As shown, the EXTEST boundary scan instruction has been directed to the Processor chip 502. EXTEST instructions are typically implemented to place the Processor chip 502 into external boundary test mode. In this mode, test data is shifted between the Processor chip's TDI pin 508 and the Processor chip's TDO pin 510 via a Boundary Data Register 528 of the Processor chip 502. The test data is then shifted out of the Processor chip 502 via TDO pin 510 and into the RAM chip via TDI pin 514, carrying with it the BYPASS boundary scan instruction. The BYPASS boundary scan instruction is typically implemented to rapidly move data through a chip of a boundary scan chain without affecting normal operation of the chip. In response to the BYPASS boundary scan instruction, test data in the illustrated system 500 is shifted between the RAM chip's TDI pin 514 and the RAM chip's TDO pin 516 via a BYPASS register 530 of the RAM chip 504. The test data is then shifted out of the RAM chip via TDO pin 516 and is output via the edge connector output TDO 526, where it may be received by a user via the boundary scan interface for analysis.

One of the problems with utilizing EXTEST in a system 500 as described above is that sensitive data on the RAM chip 504 may be compromised. For example, during the Update phase of EXTEST, the Processor chip's TAP controller 512 causes test patterns to be driven off-chip via the Processor chip's data pins 520 onto the data pins 522 of the RAM chip 504, thereby allowing for testing of board-level interconnects 532 between the two chips. However, the test patterns may be interpreted by the RAM chip 504 as a normal Processor read command. Consequently, the RAM chip 504, typically equipped with data pins 522 which are bi-directional, may transfer sensitive data via these pins 522 from the RAM chip to the data pins 520 of the Processor chip 502. Once received by the Processor chip's data pins 520, the RAM chip's sensitive data may be shifted with the test data out of the Processor chip 502, (i.e., during serial Shift phase of EXTEST) through the RAM chip via the BYPASS register, out of the RAM chip via TDO pin 516, and to the edge connector output TDO 526, where it may be obtained by a user via the boundary scan interface. The above scenario is problematic because if the EXTEST is established to be freely accessible (i.e., no passwords, codes need to be known by the user), any user can run the EXTEST and receive the test result data. If, as shown above, the test result data ends up including sensitive data from the RAM chip, this sensitive data could be freely accessible by any user.

Figure 6:
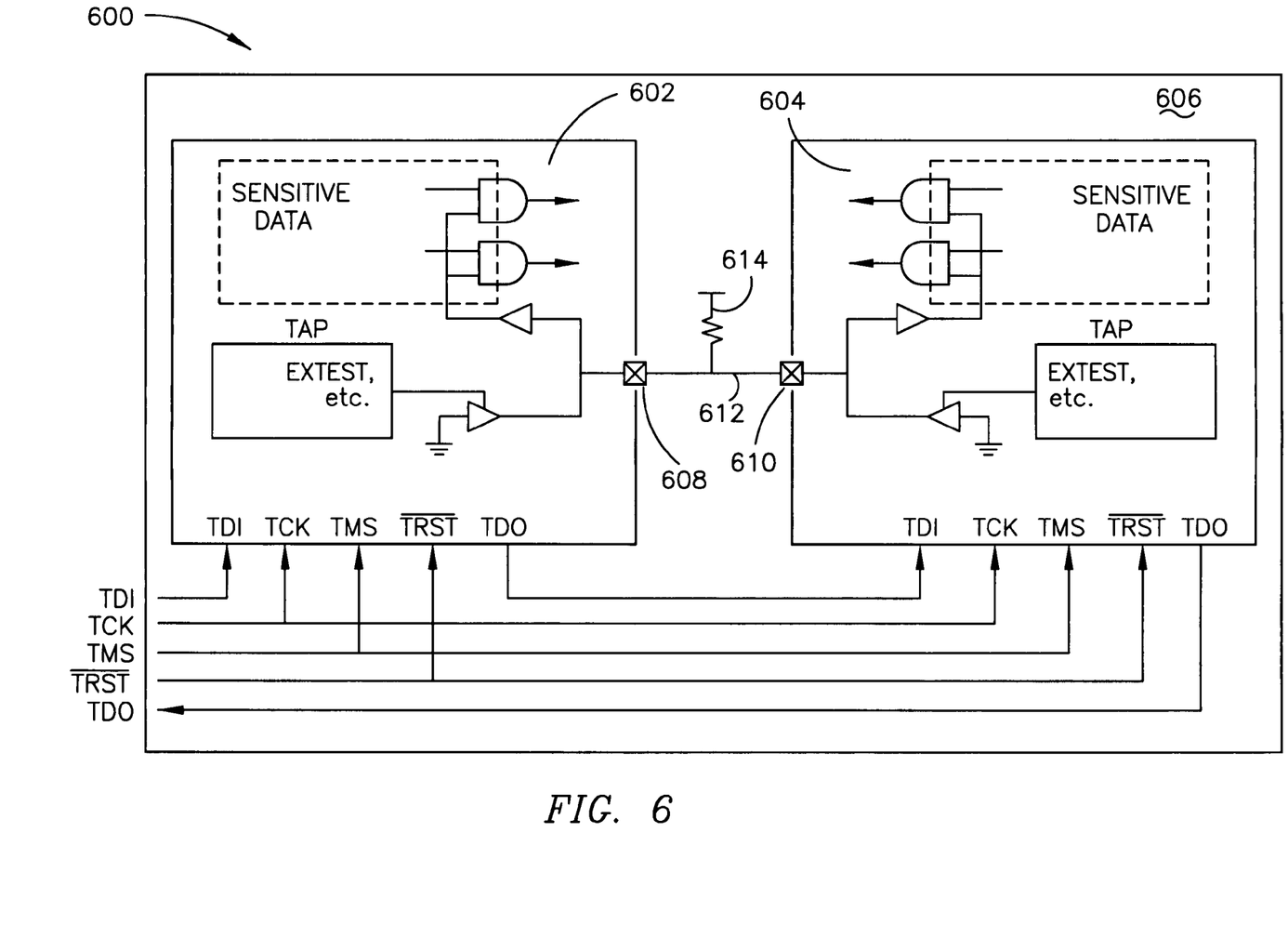
FIG. 6 is an illustration of a boundary scan system implementing Red Inhibit pins for protecting sensitive data contained within the system in accordance with an exemplary embodiment of the present invention.

FIG. 6 illustrates a boundary scan system 600 in accordance with an exemplary embodiment of the present invention, which addresses problems associated with the system shown in FIG. 5. In the illustrated embodiment, the boundary scan system includes a boundary scan chain comprising a first chip 602 and a second chip 604, each connected to a printed circuit board 606. Each chip (602, 604) includes a TDI pin, TCK pin, TMS pin, TRST pin, and TDO pin. Each chip (602, 604) further includes a TAP controller. The TDO pin of the first chip 602 is communicatively connected with the TDI pin of the second chip 604. Further, the TDI pin of the first chip 602 is communicatively connected with an edge connector input TDI of the printed circuit board 606, while the TDO pin of the second chip 604 is communicatively connected with an edge connector output TDO of the printed circuit board 606. Further, the TCK, TMS, and TRST pins of each chip (602, 604) are communicatively connected to corresponding TCK, TMS, and TRST inputs of the circuit board 606. Additionally, each chip containing sensitive data is configured with an inhibit pin, such as a Red Inhibit (RINH) pin 608, 610. In the illustrated embodiment, both the first and second chips 602, 604 contain sensitive data, therefore, both chips are configured with RINH pins 608 and 610. The RINH pin 608 of the first chip 602 is communicatively coupled with the RIH pin 610 of the second chip 604. Each RINH pin (608, 610) is controlled by the TAP controller of its respective chip (602, 604). However, since RINH is a wire-ORed signal, each RINH pin (608, 610) may be controlled by the TAP controller of any chip (602, 604) in the boundary scan chain. For instance, if a user elects to perform EXTEST on the first chip 602, the first chip will enter test mode and the TAP controller of the first chip 602 will cause test patterns to be loaded in preparation for transfer via the output pins (not shown) of the first chip 602 to the input pins (not shown) of the second chip 604. In the present embodiment, the RINH pins (608, 610) may serve as an output pin 608 of the first chip 602 and an input pin 610 of the second chip 604 which are communicatively connected via an interconnect 612 of the circuit board.

In the illustrated embodiment, because sensitive data is contained by the first chip 602, the RINH pin 608 will be driven low by a TAP control signal received from the TAP controller of the first chip 602. Such action will cause the first chip 602 to inhibit any sensitive data from exiting protected areas of the chip, thereby preventing the sensitive data from eventually being shifted out to the edge connector output TDO and being accessible to the user performing the test. The second chip, because it also contains sensitive data, will also have its RINH pin 610 driven low by a TAP control signal received from the TAP controller of the second chip 604, thereby inhibiting exit of sensitive data from protected areas of the second chip 604. The system 600 may further include a pull-up resistor 614, communicatively coupled to the interconnect 612 between the RINH pins (608, 610) for allowing RINH to be driven high in the absence of a TAP control signal (ex. —during non-testing mode), thus allowing data to be freely transferred between the chips 602, 604 via the interconnect 612.

Figure 7:
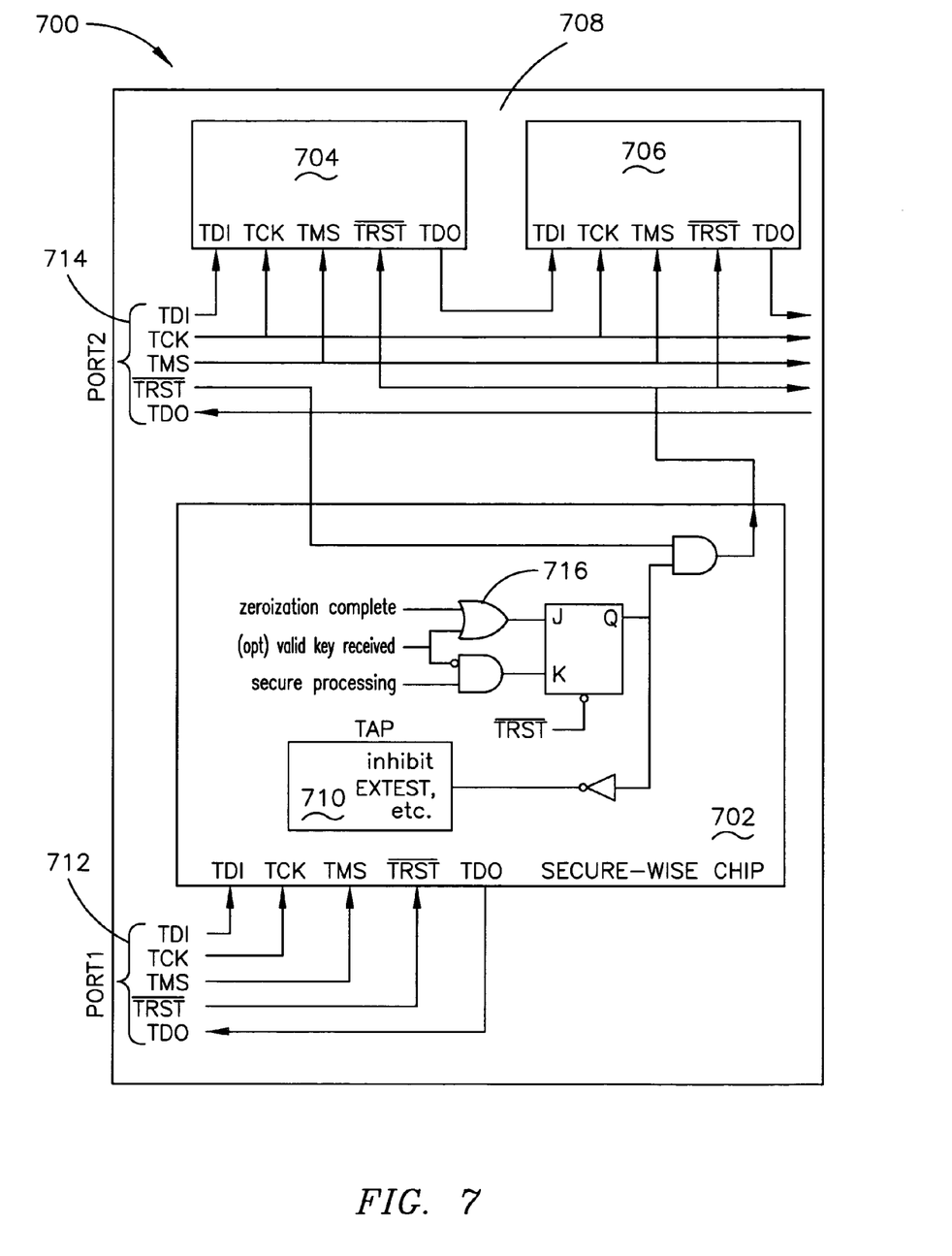
FIG. 7 is an illustration of a boundary scan system implementing a secure-wise chip for protecting sensitive data contained within the system in accordance with an exemplary embodiment of the present invention.

FIG. 7 illustrates a boundary scan system 700 in accordance with an exemplary embodiment of the present invention. The system includes a first chip 702, a second chip 704, and a third chip 706 each connected to a printed circuit board 708. Further, the chips (702, 704, 706) are each communicatively connected to one another via the printed circuit board 708. In the present embodiment, the first chip 702 is a secure-wise chip which includes an enhanced TAP controller 710. The enhanced TAP controller 710 is configured for controlling boundary scan functions on each of the chips (702, 704, 706) of the system 700. In the illustrated embodiment, the secure-wise chip 702 includes a TDI pin, a TCK pin, a TMS pin, a TRST pin and a TDO pin, each communicatively coupled with a first set of corresponding circuit board edge connectors 712, the first set of circuit board edge connectors 712 being accessible via a first boundary scan interface (designated as PORT 1). Further, the second chip 704 and the third chip 706 both include a TDI pin, a TCK pin, a TMS pin, a TRST pin and a TDO pin, each communicatively coupled with a second set of corresponding circuit board edge connectors 714, the second set of circuit board edge connectors 712 being accessible via a second boundary scan interface (designated as PORT 2).

In the illustrated embodiment, the enhanced TAP controller 710 of the secure-wise chip 702, working in conjunction with on-chip logic 716 of the secure-wise chip 702, may control boundary scan interface access to any of the chips (702, 704, 706) of the system 700. For example, a user attempting to perform a boundary scan function on the second chip 704 and a BYPASS boundary scan function on the third chip, via the PORT 2 boundary scan interface. In an attempt to prevent the possibility of compromising any sensitive data which may be contained within the second or third chip (704, 706), such as may occur in the system described in FIG. 5 above, the TAP controller 710 of the secure-wise chip 702 may disable boundary scan interface access to the second and third chips via the PORT 2 boundary scan interface until the secure-wise chip 702 receives confirmation that the second and third chips have been sanitized (i.e., contain no sensitive data). The enhanced TAP controller 710 of the secure-wise chip may contain an instruction for initiating/performing sanitization (i.e., zeroization). Once the secure-wise chip 702 receives confirmation, via its on-chip logic 716, that sanitization is complete, the TAP controller 710 may cause the secure-wise chip 702 to restore boundary scan interface access to the second and third chips (via the PORT 2 interface). Further, the secure-wise chip 702 may also disable boundary scan interface access to itself, such as via the PORT 1 boundary scan interface, until the secure-wise chip 702 receives confirmation that sanitization of each of the chips (702, 704, 706) of the system 700 is complete, at which point, boundary scan interface access may be restored. Moreover, if, at any time, the on-chip logic 716 of the secure-wise chip 702 signals that processing has produced sensitive data within the system 700, the secure-wise chip 702 may disable any further boundary scan interface access to the system 700. By providing a secure-wise chip 702 as discussed above, sensitive data may be protected, while still allowing for factory and field access to boundary scan functions such as EXTEST and BIST without requiring key string or password entry.

In additional embodiments, the on-chip logic 716 of the secure-wise chip 702 may be configured with key string compare logic (as shown in FIGS. 2 and 3 above) for allowing authorized users boundary scan interface access to chips under the control of the secure-wise chip 702. It is contemplated that the system 700 implementing the secure-wise chip 702, and the system 600 implementing RINH pins (608, 610) may require thermal spray or the like to protect said systems 600, 700 against tampering.

In further embodiments, on-chip key string compare logic (as shown in FIGS. 2 and 3) may be implemented for restricting access to microprocessor debug functions via a boundary scan interface. Further, it is contemplated that the on-chip key string compare logic implemented for restricting access to microprocessor debug may implement a plurality of key strings in which a key string of the plurality of key strings is allocated for accessing a corresponding partition channel.

Figure 8:
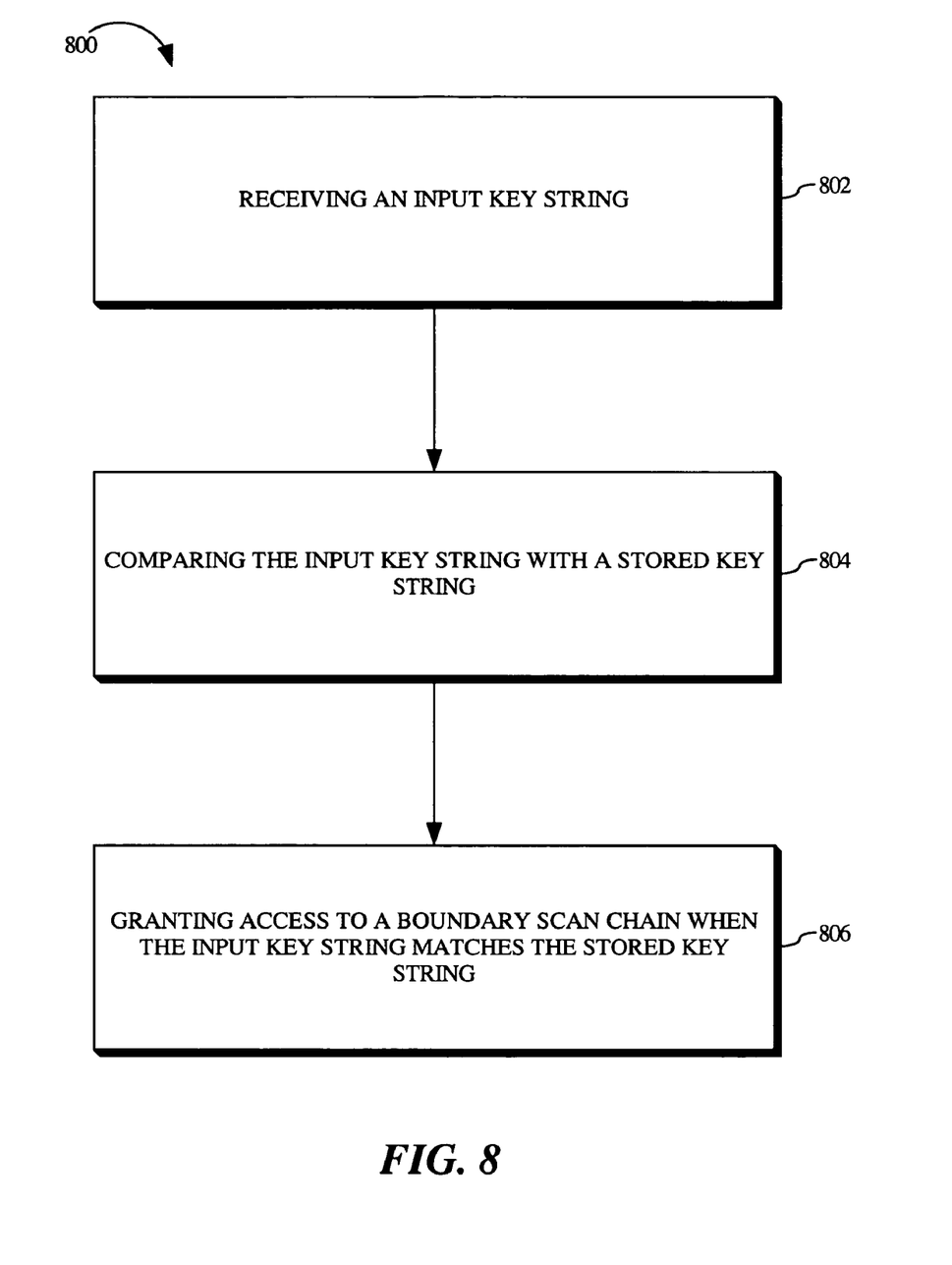
FIG. 8 is a flow chart illustrating a method for providing secure boundary scan interface access in accordance with an exemplary embodiment of the present invention.

FIG. 8 is a flow chart illustrating a method in accordance with an exemplary embodiment of the present invention. The method 800 includes receiving an input key string 802. The method 800 further includes comparing the input key string with a stored key string 804. The method 800 further includes granting access to a boundary scan chain when the input key string matches the stored key string 806. In an exemplary embodiment, the boundary scan chain is a Boundary Data Register of at least one Joint Test Action Group (JTAG)-compliant device. In further embodiments, the boundary scan chain is a plurality of communicatively coupled JTAG-compliant devices.

Figure 9:
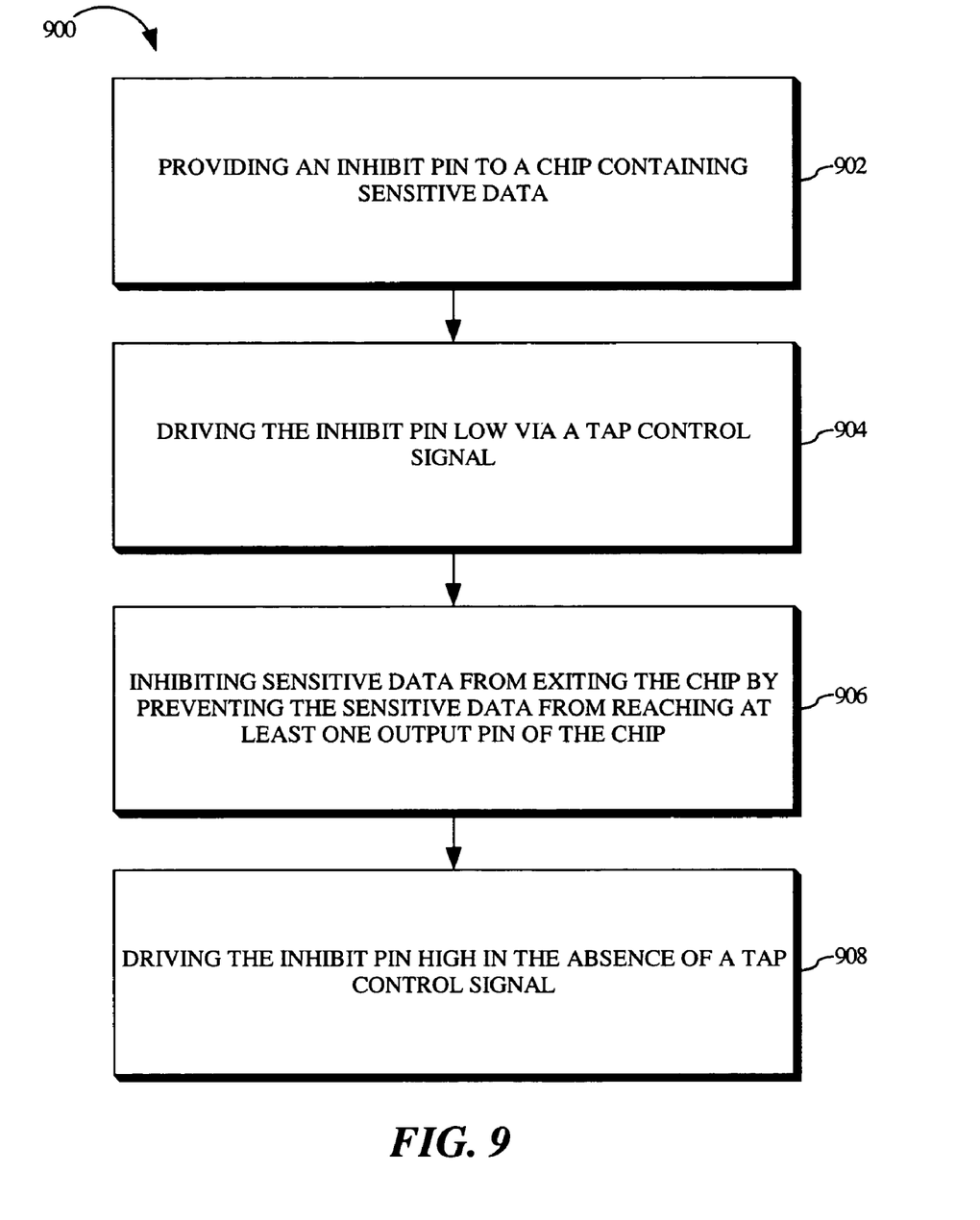
FIG. 9 is a flow chart illustrating a method for providing secure boundary scan interface access in accordance with an exemplary embodiment of the present invention.

FIG. 9 is a flow chart illustrating a method in accordance with an exemplary embodiment of the present invention. The method 900 includes providing an inhibit pin, such as a Red Inhibit (RINH) pin, to a chip containing sensitive data 902. The method further includes driving the inhibit pin low via a Test Access Port (TAP) control signal 904. The method 900 further includes inhibiting sensitive data from exiting the chip by preventing the sensitive data from reaching at least one output pin of the chip 906. The method 900 further includes driving the inhibit pin high in the absence of a TAP control signal 908.

Figure 10:
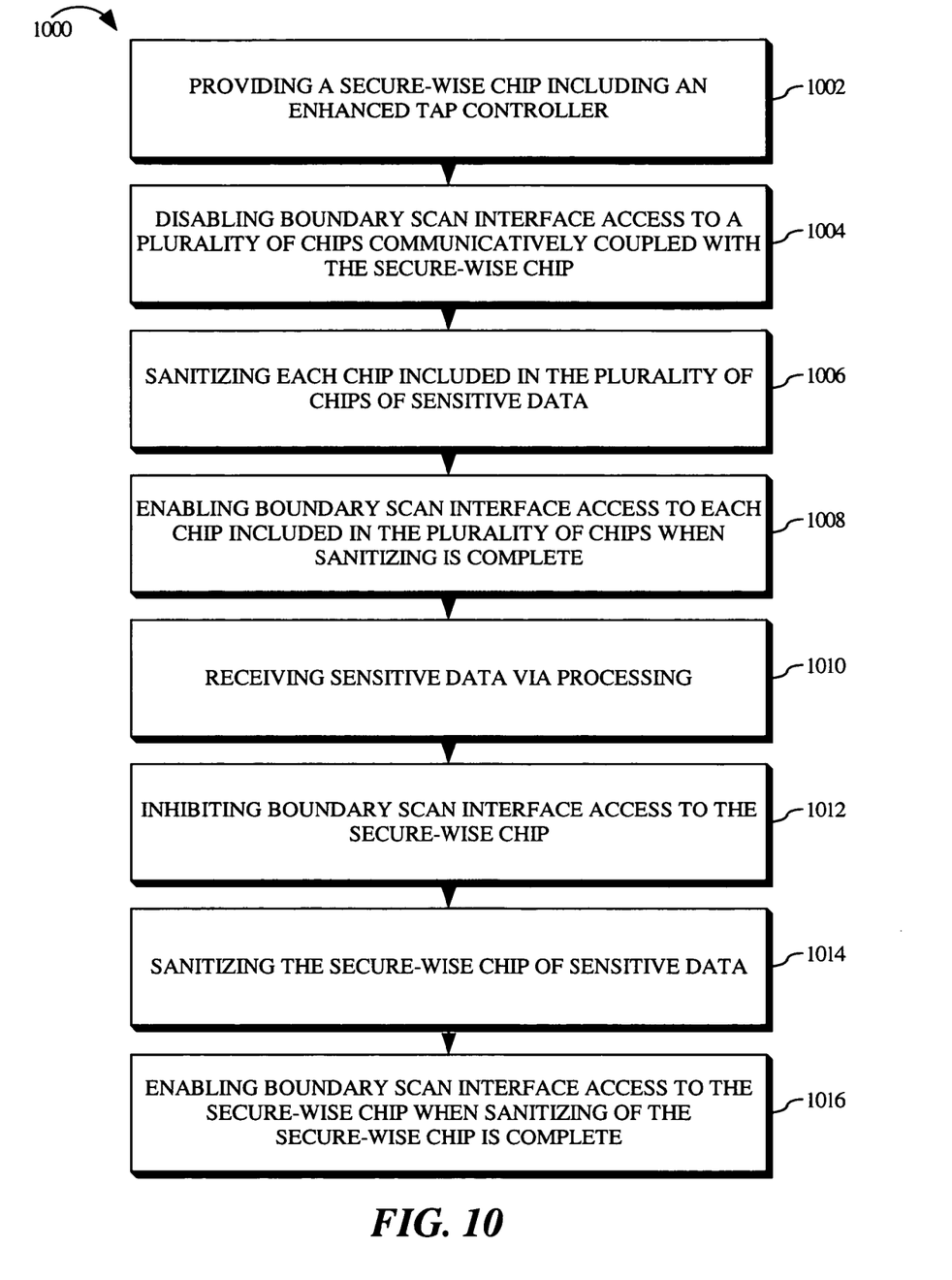
FIG. 10 is a flow chart illustrating a method for providing secure boundary scan interface access in accordance with an exemplary embodiment of the present invention.

FIG. 10 is a flow chart illustrating a method in accordance with an exemplary embodiment of the present invention. The method 1000 includes providing a secure-wise chip including an enhanced Test Access Port (TAP) controller 1002. The method 1000 further includes disabling boundary scan interface access to a plurality of chips, each chip included in the plurality of chips being communicatively coupled with the secure-wise chip 1004. The method 1000 further includes sanitizing each chip included in the plurality of chips of sensitive data 1006. The method 1000 further includes enabling boundary scan interface access to each chip included in the plurality of chips when sanitizing is complete 1008. The method 1000 further includes receiving sensitive data via processing 1010. The method 1000 further includes inhibiting boundary scan interface access to the secure-wise chip 1012. The method 1000 further includes sanitizing the secure-wise chip of sensitive data 1014. The method 1000 further includes enabling boundary scan interface access to the secure-wise chip when sanitizing of the secure-wise chip is complete 1016.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus, comprising:
    a shift register including a plurality of flip-flops for receiving an input key string;
    a plurality of XNOR gates communicatively coupled with the shift register for comparing the input key string with a stored key string; and
    a multi-input AND gate communicatively coupled with the plurality of XNOR gates for receiving input signals from the plurality of XNOR gates,
    wherein the input signals received from the plurality of XNOR gates drive the AND gate high when the input key string matches the stored key string, thereby granting a user access to a boundary scan chain, the boundary scan chain being at least one of: a Boundary Data Register of at least one Joint Test Action Group (JTAG)-compliant device; or, a plurality of communicatively coupled JTAG-compliant devices.

2. An apparatus as claimed in claim 1, wherein the stored key string is fixed.

3. An apparatus as claimed in claim 1, wherein the stored key string is programmable.

4. An apparatus as claimed in claim 1, wherein the stored key string includes at least one lock-out bit.

5. An apparatus as claimed in claim 1, wherein the stored key string includes at least one inconsequential bit.

* * * * *